United States Patent
Cook et al.

(10) Patent No.: US 9,525,263 B2
(45) Date of Patent: Dec. 20, 2016

(54) LASER DIODE SIDE PUMPING OF AN ELONGATED SOLID-STATE LASER WITHOUT FOCUSING/OPTICS

(71) Applicant: Thales Holdings UK Plc, Surrey (GB)

(72) Inventors: Trevor Cook, Glasgow (GB); Stephen Lee, Glasgow (GB); Mark Silver, Glasgow (GB)

(73) Assignee: THALES HOLDINGS UK PLC, Surrey (GB)

( * ) Notice: Subject to any disclaimer, the term of this patent is extended or adjusted under 35 U.S.C. 154(b) by 0 days.

(21) Appl. No.: 14/431,943

(22) PCT Filed: Aug. 8, 2013

(86) PCT No.: PCT/GB2013/052121
§ 371 (c)(1),
(2) Date: Mar. 27, 2015

(87) PCT Pub. No.: WO2014/049324
PCT Pub. Date: Apr. 3, 2014

(65) Prior Publication Data
US 2015/0263479 A1    Sep. 17, 2015

(30) Foreign Application Priority Data

Sep. 28, 2012 (GB) .................................. 1217379.5

(51) Int. Cl.
*H01S 3/0941* (2006.01)
*H01S 3/06* (2006.01)
(Continued)

(52) U.S. Cl.
CPC ........... *H01S 3/0941* (2013.01); *H01S 3/0405* (2013.01); *H01S 3/061* (2013.01); *H01S 3/0606* (2013.01);
(Continued)

(58) Field of Classification Search
CPC ...... H01S 3/0941; H01S 3/0405; H01S 3/061; H01S 3/0617; H01S 3/0625; H01S 3/094084; H01S 3/11; H01S 3/1608; H01S 3/1618; H01S 3/17
See application file for complete search history.

(56) References Cited

U.S. PATENT DOCUMENTS 5,052,815 A * 10/1991 Nightingale .......... H01S 3/0606
372/100
5,140,607 A    8/1992 Paiva
(Continued)

OTHER PUBLICATIONS

International Search Report for PCT/GB2013/052121, dated Nov. 4, 2013.

*Primary Examiner* — Xinning Niu
(74) *Attorney, Agent, or Firm* — Hauptman Ham, LLP

(57) ABSTRACT

A side pumped laser comprises an elongated gain medium (10) provided between an output coupler (20) and a counter reflector (15) and a pump source (65) configured to provide radiation to the gain medium (10) along a side axis of the gain medium, wherein the laser is configured such that radiation from the pump source is directly incident on the gain medium; and the pump source is provided proximate, adjacent or in contact with the gain medium. The laser material and compositions, geometries and dimensions are designed to both maximize laser performance and to permit the use of construction techniques commonplace in the production of equipment designed for optical telecoms systems to facilitate low cost high volume and miniaturization. The elongated gain medium (10) may have a polygonal cross-section with a non-coated side surface (55) receiving pump light emitted by a laser diode bar (65) while the other, non-emitting surfaces are coated with for example a gold coating (60) for pump light recycling and cooling of the gain medium by heat conduction. The counter reflector (15) may (Continued)

be provided on one facet of a passive Q-switch (30) and the output coupler (20) on a facet (50*b*) of the gain medium (10).

13 Claims, 5 Drawing Sheets

(51) Int. Cl.
*H01S 3/094* (2006.01)
*H01S 3/16* (2006.01)
*H01S 3/17* (2006.01)
*H01S 3/04* (2006.01)
*H01S 3/11* (2006.01)
*H01S 3/113* (2006.01)
*H01S 5/40* (2006.01)
*H01S 3/02* (2006.01)

(52) U.S. Cl.
CPC ........... *H01S 3/0617* (2013.01); *H01S 3/0625* (2013.01); *H01S 3/094084* (2013.01); *H01S 3/11* (2013.01); *H01S 3/1608* (2013.01); *H01S 3/1618* (2013.01); *H01S 3/17* (2013.01); *H01S 3/025* (2013.01); *H01S 3/113* (2013.01); *H01S 5/4025* (2013.01)

(56) References Cited

U.S. PATENT DOCUMENTS

| | | | | |
|---|---|---|---|---|
| 5,249,196 | A | * | 9/1993 | Scheps ........................ 372/93 |
| 5,463,649 | A | | 10/1995 | Ashby |
| 5,570,387 | A | * | 10/1996 | Carriere ............... H01S 3/0941 |
| | | | | 372/39 |
| 5,572,541 | A | | 11/1996 | Suni |
| 2004/0066805 | A1 | * | 4/2004 | Afzal ................... H01S 3/0606 |
| | | | | 372/10 |
| 2005/0074041 | A1 | * | 4/2005 | Sommerer ............. H01S 3/042 |
| | | | | 372/34 |

* cited by examiner

LASER DIODE SIDE PUMPING OF AN ELONGATED SOLID-STATE LASER WITHOUT FOCUSING/OPTICS

This application is a National Stage of International Application no. PCT/GB2013/052121 filed on Aug. 8, 2013, which claims the benefit of Great Britain Application no. 1217379.5 filed on Sep. 28, 2012.

The present invention relates to a side pumped laser.

BACKGROUND

Side pumped laser systems are laser systems in which the pump radiation is provided from a pump source to an elongated gain medium along a side of the gain medium that extends parallel to its long axis, i.e. the pump radiation is provided perpendicularly to the beam axis.

However, such side pumped laser systems are often inefficient due to divergence of the pump radiation between the light source and the gain medium. In order to address this issue, it is common practice in the art to provide various optical components, such as a cylindrical lens and focussing optics, between the pump source and the gain medium in order to focus or collimate the beam. However, this increases cost and can potentially result in alignment issues.

It is an object of at least one embodiment of the present invention to provide an improved side pumped laser. It is an object of at least one embodiment of the present invention to eliminate or mitigate at least one problem with the prior art. Particularly, it is an object of at least one embodiment of the present invention to provide a more compact and/or robust and/or stable and/or low cost side pumped laser.

STATEMENTS OF INVENTION

According to a first aspect of the present invention is a side pumped laser comprising:
an elongated gain medium provided between an output coupler and a counter reflector; and
a pump source configured to provide radiation to the gain medium along a side or long axis of the gain medium.

The laser may be configured such that radiation from the pump source is directly incident on the gain medium, i.e. the light from the pump source may be incident on the gain medium without passing through other optical components, such as a cylindrical lens and/or focussing optics.

The pump source may be provided in contact with, adjacent or proximate the gain medium. For example, the pump source may be provided within 2 mm, preferably within 1 mm and most preferably within 0.2 mm of the gain medium. The pump source and the gain medium may be closely coupled.

The pump source may comprise a light source, such as a laser diode, and the radiation may comprise light. The pump source may comprise an array of light sources. The pump source (e.g. the array) may be elongated or extend along at least part and optionally all of the length of the gain medium.

The laser may be configured such that light received from the pump source by the gain medium is diverging, e.g. the pump radiation may be cone shaped. The laser may be configured such that the pump radiation is non-focussed, The gain medium may comprise an Erbium-Ytterbium-doped glass rod. However, it will be appreciated that other gain media may be used.

The gain medium may comprise a rod that has a non-circular or non-curved cross section such as a quadrilateral cross section, for example, a square sectioned rod. The quadrilateral cross-section better suits the cone-shaped pump radiation. In addition, the pump beam is not focused to specific points within the gain medium leading to more uniform pumping and improved laser output properties.

The gain medium may comprise an input surface, which may comprise a flat input facet of the gain medium. The input surface may extend along a side or a longitudinal surface of the gain medium and optionally extends along the length of the gain medium. The input surface may correspond with the pump source. The input surface may be provided facing and/or adjacent, proximate and/or in contact with the pump source. In this way, the input surface may be arranged to receive the pump radiation from the pump source. The input surface may comprise a commuted, flattened, formed or removed edge, corner or apex of the gain medium, such as a corner of the square cross section. The input surface may be less than 300 microns wide, preferably less than 200 microns wide and most preferably less than 100 microns wide.

The gain medium may be provided with a reflective coating. The reflective coating may be thermally conductive. The reflective coating may comprise a metallised coating, preferably a gold coating. A gold coating may advantageously provide good reflectivity and thermal conductivity. The reflective coating may be provided on long faces or surfaces (i.e. the sides) of the gain medium. The input surface may be uncoated with reflective coating (in other words, the input surface may be left transparent), or may be coated to reduced reflections of the incident pump beam.

The side pumped laser may be configured such that the pump radiation is matched to a volume of a single TEM00 mode.

The doping of the gain medium may be adapted to result in a beam spot size that corresponds to at least one dimension of the gain medium and/or to control the power density of the beam, for example to avoid optical damage to sensitive optical components or coatings.

The laser may comprise a Q-switch, such as a passive Q-switch. The passive Q-switch may be integrated with the counter reflector or the output coupler.

The counter reflector may comprise a highly reflective coating, such as a dielectric coating. The counter reflector or the output coupler may be provided on a terminal end of the gain medium and/or an external surface of the Q-switch.

The laser may comprise a housing and/or container for receiving one or more components of the laser. The housing and/or container may contain or be configured to receive the gain medium, the pump source, the counter reflector, the output coupler and/or the Q-switch.

At least one dimension and optionally the largest dimension of the gain medium and/or the Q-switch and/or the pump source and/or the housing or container may be less than 5 cm, preferably less than 3 cms and most preferably less than or equal to 2 cm.

The pump source may comprise or be connectable or in communication with drive electronics and/or a controller. The drive electronics and/or controller may be provided in, or be external to, the housing and/or container.

The gain medium, the pump source and/or the Q-switch may be supported by and/or abut the housing and/or container. The housing and/or container may be dimensioned to correspond with at least one combined dimension of the gain medium, pump source, drive electronics and/or controller and/or q-switch.

The housing and/or container may be provided with an output aperture that is provided at or along the beam axis from the output coupler.

The housing and/or container may comprise electrical connections for supplying power and/or control signals to the pump source.

The housing or container may comprise a thermally conductive material. The housing or container may comprise a metallic material, a ceramic material and/or the like.

According to a second aspect of the present invention is an apparatus or system comprising the laser of the first aspect. The apparatus or system may comprise or be comprised in a sensor, a laser designator, a rangefinder, a laser illuminated imaging system, and/or the like.

According to a third aspect of the present invention is a method of producing a laser according to the first aspect, the method comprising providing the pump source of the laser in contact with, adjacent or proximate a long side of the gain medium. The pump source may be arranged so as to directly pump the gain medium, e.g. not via a cylindrical lens and/or focussing optics.

The method may comprise mounting the gain medium and/or the pump source and/or the Q-switch and/or the drive electronics and/or controller in a housing and/or container.

It will be appreciated that features analogous to those described in relation to any of the above aspects may be individually and separably and/or jointly applicable to any of the other aspects, even if those features are only described in combination with other features.

Method features corresponding to use of any features described above in relation to an apparatus and/or apparatus features configured to implement any features described above in relation to a method are also intended to fall within the scope of the present invention.

BRIEF DESCRIPTION OF THE DRAWINGS

The invention will be described herein with respect to the following drawings.

DETAILED DESCRIPTION OF THE DRAWINGS

Figure 1:
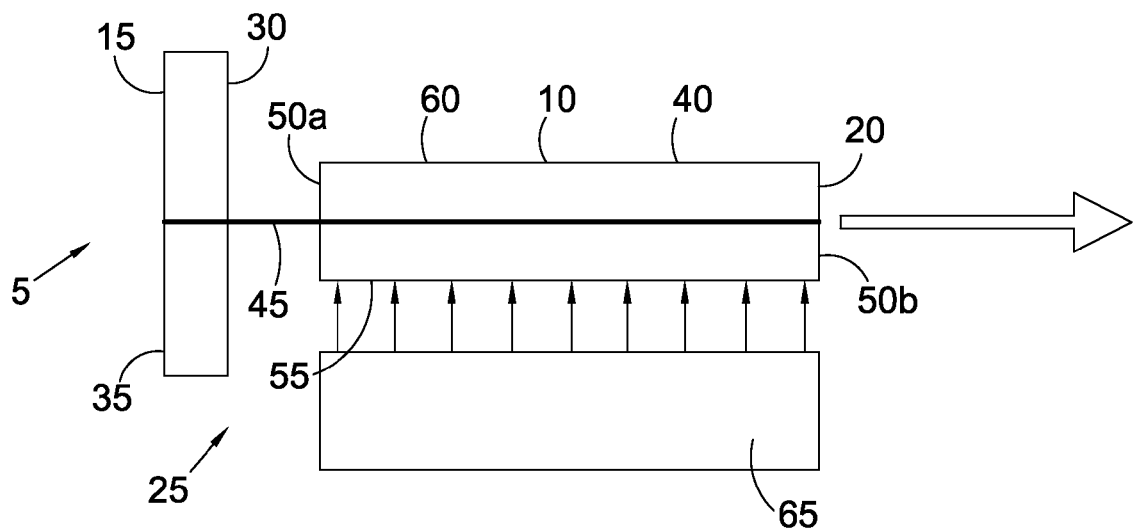
FIG. 1 shows a top side plan schematic of a laser resonator.
Figure 2:
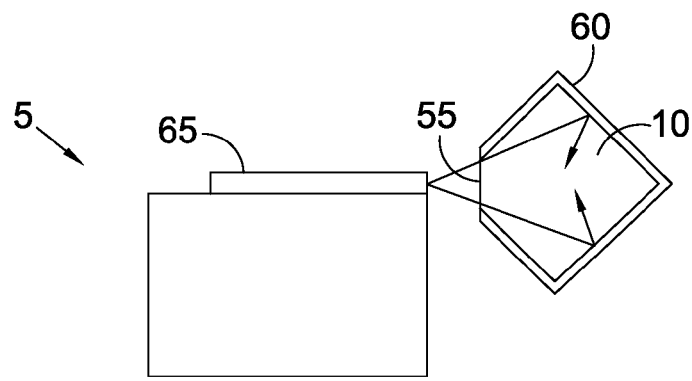
FIG. 2 shows a side elevation schematic of the laser resonator shown in FIG. 1.
Figure 3:
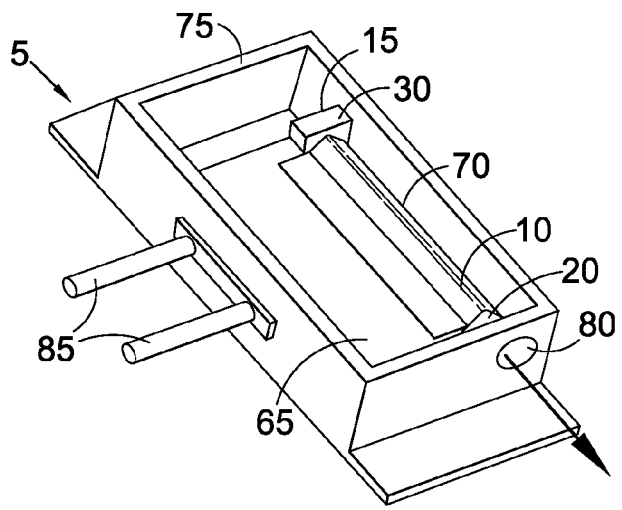
FIG. 3 shows a cut-away elevation view of a laser comprising the resonator shown in FIG. 1.

FIGS. 1 to 3 show a side pumped laser resonator 5 that comprises an elongated rod of gain medium 10 provided between an end reflector 15 and a partially reflective output coupler 20 in order to form a resonant cavity 25. A passive Q-switch 30 is provided between the end reflector 15 and the gain medium 10. In this embodiment, the end reflector 15 is coated on a surface 35 of the Q-switch 30 that is on an opposite side of the Q-switch 30 to the gain medium 10 such that the Q-switch 30 and the end reflector 15 are integral.

For the avoidance of doubt, the sides 40 of the gain medium 10 extend in the longitudinal dimension of the gain medium 10, parallel to the beam axis 45, whilst the opposing ends 50a, 50b of the gain medium 10 extend radially. The opposing ends 50a, 50b of the gain medium 10 in this embodiment respectively face the Q-switch 30 and the output coupler 20.

The gain medium 10 comprises a rod that has a cross section that is square apart from a longitudinally extending flat input surface 55 that is provided instead of a corner of the sides 40 of the gain medium 10. The input surface 55 extends substantially along the length of the gain medium 10. In this example, the input surface is 300 microns wide.

The external surfaces of the sides 40 of the gain medium 10 are coated with a reflective and thermally conductive coating 60 in the form of a gold coating, with the input surface 55 remaining uncoated and transparent. The reflective coating 60 on the rod sides 40 is arranged to contain and optimise the divergent, cone shaped, non-focussed pump radiation emitted by a pump source 65, which is matched to a single TEM00 mode volume.

The pump source 65 is in the form of a laser diode array extends longitudinally along the length of the gain medium 10, wherein the pump source 65 is proximate and closely coupled to the input surface 55 such that light from the pump source 65 is directly received by the input surface 55 of the gain medium 10 without passing through any intervening optical elements, such as cylindrical lenses and/or focussing optics.

Using this arrangement, the beam axis 45 is parallel to the longitudinal axis of the gain medium 10 and perpendicular to the direction in which pump radiation is provided to the gain medium 10.

The above configuration eliminates the need for optics between the pump source 65 and the gain medium 10 and allows a divergent light source to be coupled directly and efficiently to the gain medium 10. In particular, since the pump source 65 is provided closely coupled to the gain medium 10, the distance between the pump source 65 and the gain medium 10 is minimised, thereby minimising divergence of the light between the pump source 65 and the gain medium 10. This minimises losses of light between the pump source 65 and the gain medium 10. This also allows the size of the input surface 55 to be minimised, thereby minimising loss of light from within the gain medium 10 via the uncoated input surface 55. Indeed, the divergence of the pumping radiation can be utilised by providing the reflective coating 60 on the side surfaces 40 of the gain medium 10 in order to control and optimise the distribution of radiation in the gain medium 10, as shown in FIG. 2. As such, a simplified design that can still achieve high pumping efficiencies may be provided.

The gain medium 10 advantageously comprises an Erbium-Ytterbium-doped glass rod. However, it will be appreciated that other suitable gain media could also be used. The doping of the gain medium 10 is selected to provide a tailored spot size. In particular, the spot size may be controlled such that the optical density incident remains at a sufficiently low level to prevent or minimise optical damage to the Q-switch 30 or any other optical surface within the laser beam.

The gain medium 10 is mounted via the reflective coating 60 and a heat conducting adhesive (not shown) to a mount 70 that is thermally conductive, such as a metal mount. In this way, the gold reflective coating 60 facilitates transfer of heat from the gain medium 10 via the heat conductive adhesive to the mount 70, which act as a heat sink.

As shown in FIG. 3, the gain medium 10, the pump source 65 and the integrated Q-switch 30/end reflector 15 are mounted within a suitable housing 75. Optionally, the housing 75 comprises heat conducting material, such as a metallic material to improve heat dissipation. The housing 75 is provided with an output aperture 80 aligned on the beam axis 45 with the output coupler 20. The housing 75 is also provided with power supply and control connections 85 as required. The housing 75 is closable such that the laser components 10, 15, 20, 30, 65 are contained inside.

Figure 4:
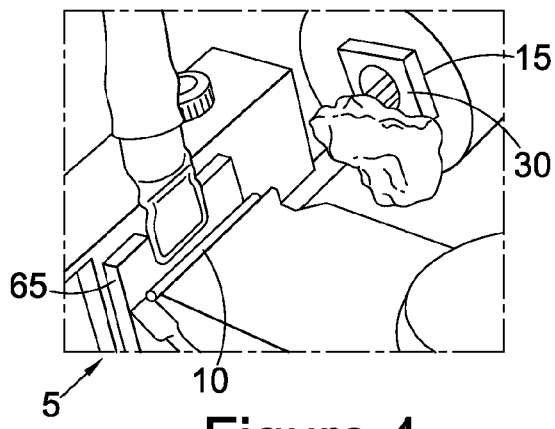
FIG. 4 shows an experimental apparatus based on the laser resonator of FIG. 1.

FIG. 4 shows a breadboard experimental set up corresponding to the laser resonator shown in FIG. 1. In this case, the end reflector reflective surface 15' is provided separate from but immediately behind the passive Q-switch 30'. The rod of gain medium 10, as described in relation to FIG. 1, is side pumped by a laser diode array 65 that extends longitudinally along the side of the gain medium 10 proximate to the input surface 55 of the gain medium 10.

Figure 5:
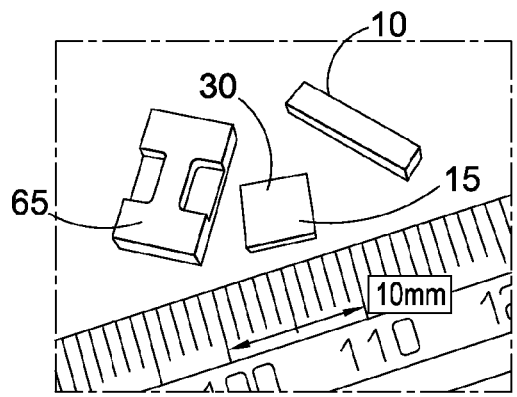
FIG. 5 is a scale image showing a pump source, a q-switch and a gain medium of the apparatus of FIG. 4.

Examples of components for use in the laser resonator are shown in FIG. 5. The small scale of the components is notable and advantageous. In the examples shown in FIGS. 1 to 3, a 2×1 cm laser diode array is used as the pump source 65 for use with a 2 cm long rod of gain medium 10. The housing 75 is approximately 3 cm long (i.e. in the direction parallel to the beam axis 45). For the components shown in FIG. 5, the laser diode array 65 is approximately 1 cm long by 0.5 cm wide, the Q-switch 30' is approximately 0.5 cm square, whilst the rod of gain medium 10 is approximately 1 cm long. Use of components such as the rod of gain medium 10, the pump diode array 65 and the Q-switch that have a longest dimension of less than 5 cm, preferably less than 3 cm and most preferably 2 cm or less represents a departure from conventional systems used in conventional laser applications, such as laser designators, in which considerably larger components are generally used. The smaller components size leads to reduced cost. Furthermore, as the dimensions of the gain medium 10 are better matched to the required output beam for the stated applications, the laser is of higher efficiency.

Furthermore, the present design is notable for the lack of componentry, with the basic system comprising only three components (i.e. the pump source 65, the rod of gain medium 10 and the integrated Q-switch 30/end reflector 15). Each of these components is capable of ready miniaturisation.

Use of such small components in conjunction with the minimal componentry of the present design advantageously permits the use of construction techniques commonplace in the production of equipment designed for optical telecoms systems such as fibre optic routers, multiplexers, switches and the like. Such techniques can optionally comprise use of micro manipulators, vacuum tongs, induction bonding and/or the like, as would be known to a skilled person in the field of telecoms.

The combination of the small component size and minimal componentry also results in a very compact overall package.

However, the present design is readily scalable, for example to increase output energy, by simply increasing the length of the rod of gain medium 10 and/or increasing the doping of the gain medium 10, for example. It will be appreciated that further laser diodes can also be added to the pump source 65.

Figure 6A:
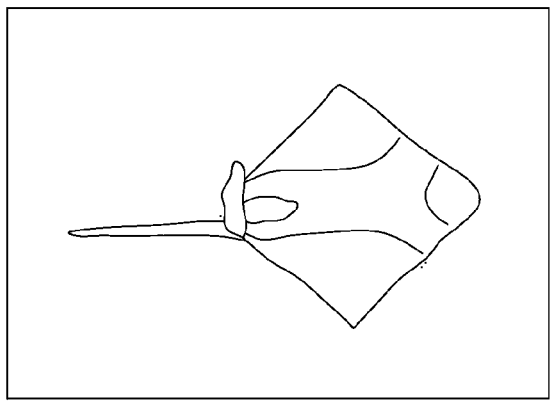
FIG. 6a is an image showing a pumped region of the rod in the apparatus of FIG. 4.
Figure 6B:
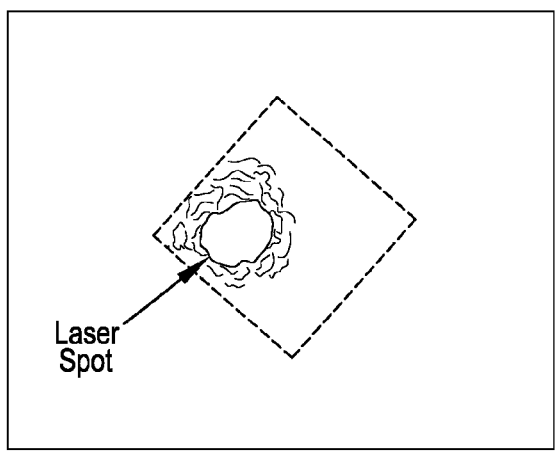
FIG. 6b is an image showing a laser spot relative to the gain medium in the apparatus of FIG. 4.
Figure 6C:
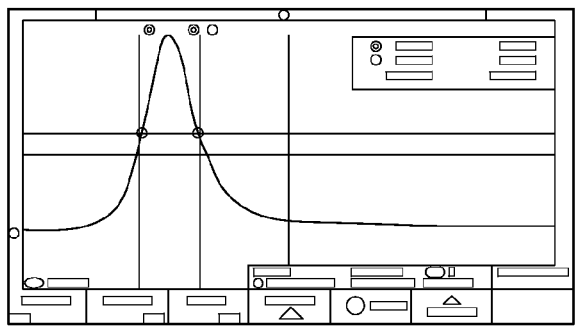
FIG. 6c is an image showing a Q-switch pulse of the apparatus of FIG. 4.
Figure 6D:
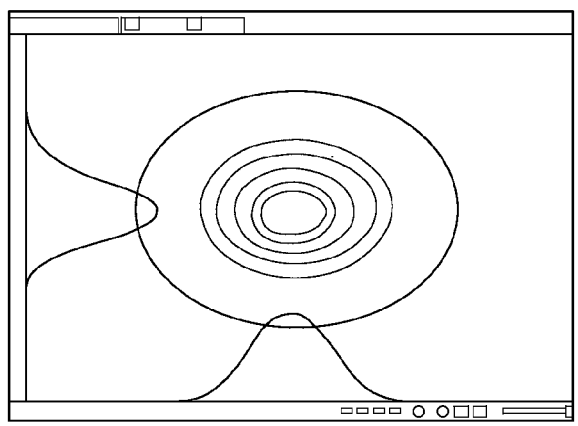
FIG. 6d is an image showing a laser beam produced by the apparatus of FIG. 4 far field.

FIGS. 6a to 6d show results obtained using the experimental set-up shown in FIG. 4. In particular, FIG. 6a shows the pump distribution in a cross section of the rod of gain medium. FIG. 6b shows the size of the laser spot relative to the cross section of the gain medium. FIG. 6c shows the Q-switch 30 pulse profile and FIG. 6d shows a far field cross section of the resultant laser beam. It is noted that the beam profile shows near diffraction limited.

It will be appreciated that although an advantageous example of the present invention is described above, variations to the above example are contemplated.

For example, it will appreciated that the present invention is operable with a wide variety of suitable gain medium materials, pumping arrangements, and resonator dimensions, as known in the art, with varying degrees of efficacy, and is not limited to any particular configuration or dimensions.

Figure 7:
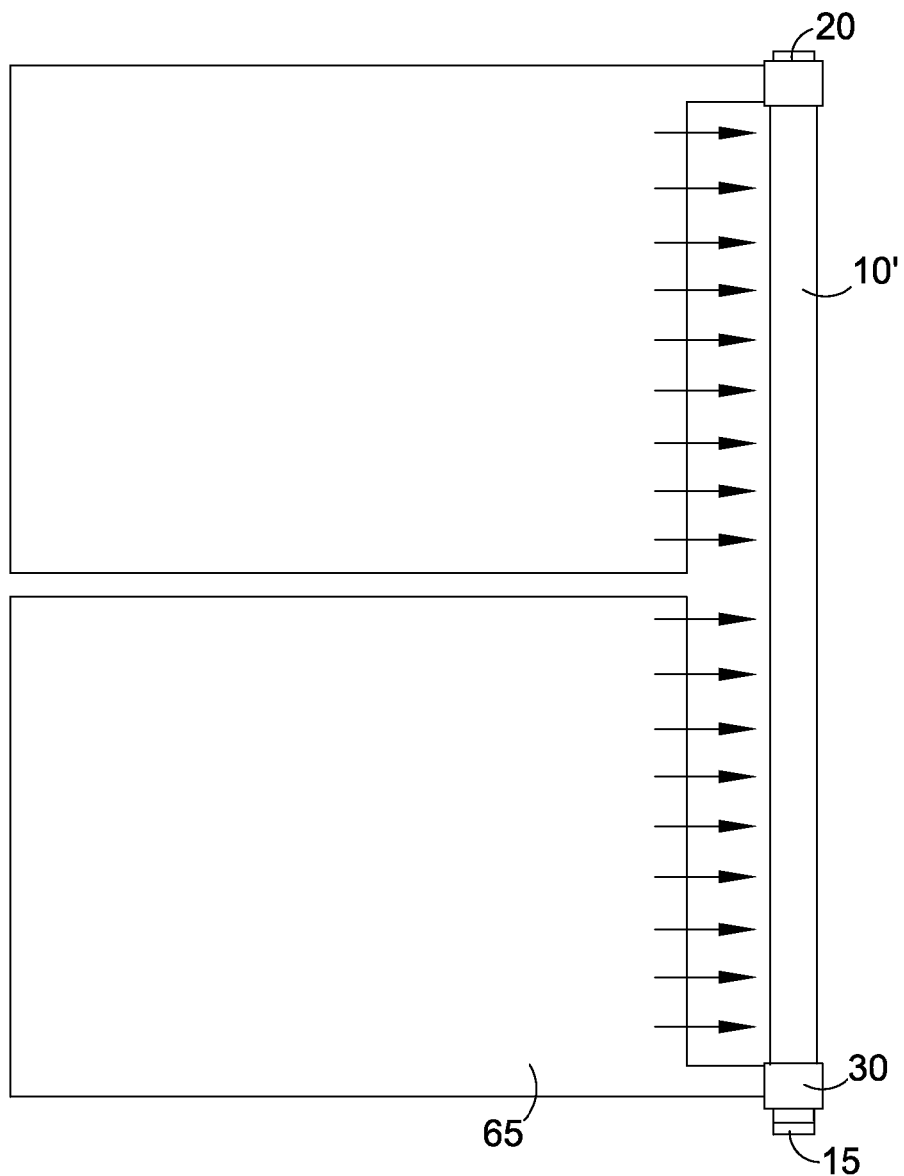
FIG. 7 shows a top side plan schematic of an alternative laser resonator.
Figure 8:
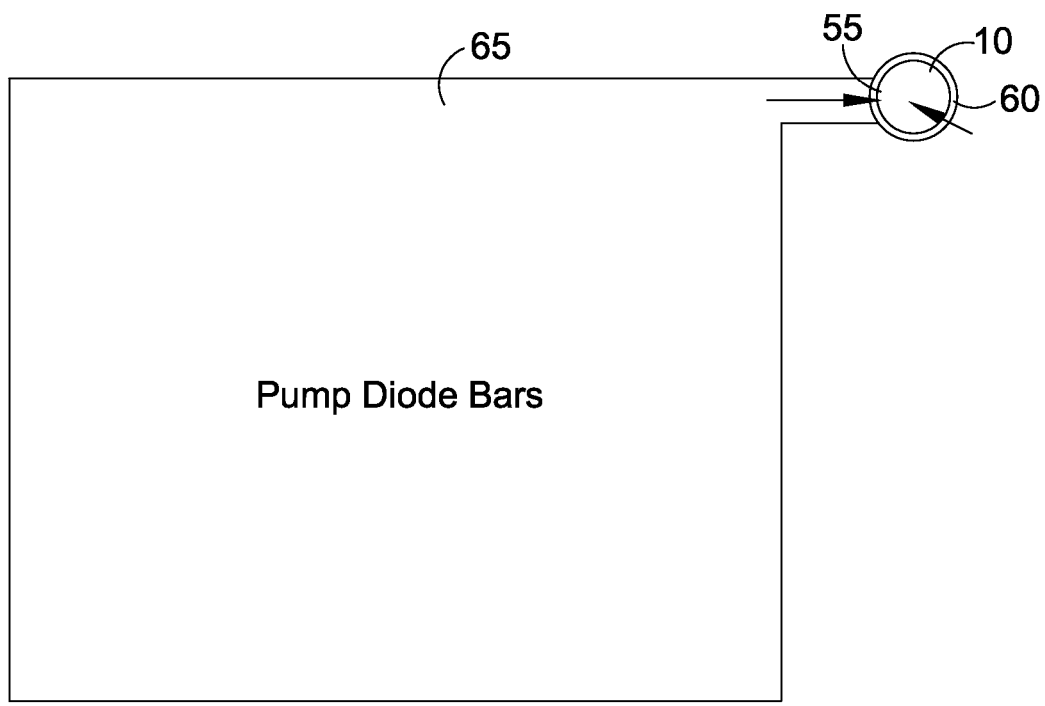
FIG. 8 shows a side elevation schematic of the laser resonator shown in FIG. 7.
Figure 9:
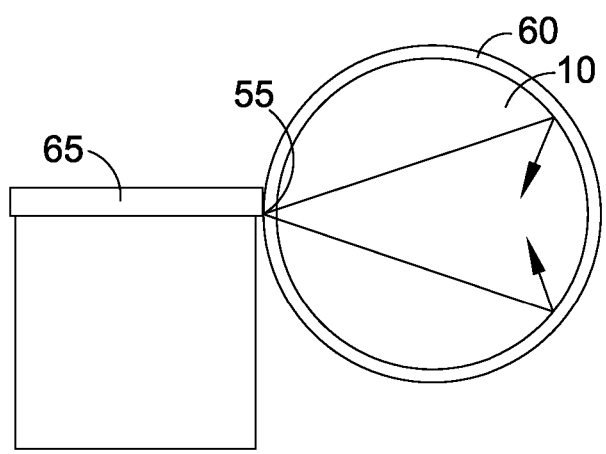
FIG. 9 shows a side elevation schematic of a part of the laser resonator shown in FIG. 7.

Although the example described above has a rod of gain medium 10 having a cross sectional profile that is a modified square having a flatted corner, it will be appreciated that other configurations of gain medium 10 may be used. For example, an alternative laser resonator arrangement that comprises a rod of gain medium 10' having a circular cross section is shown in FIGS. 7 to 9 where the gain medium is attached with the pump laser mount by end brackets. The other components are substantially the same as those described in relation to the embodiment of FIGS. 1 to 4.

Furthermore, whilst the rod of gain medium 10 is advantageously an Erbium-Ytterbium doped glass rod, it will be appreciated that other suitable gain media may be used. Similarly, although gold is advantageously used for the reflective coating 60, it will be appreciated that other reflective coatings or other techniques for producing internal reflection may be used.

In addition, although the above example is described as having an integrated Q-switch 30 and counter/end reflector 15, it will be appreciated that the counter/end reflector 15 and the Q-switch 30 may be provided separately. In embodiments of the present invention, the output coupler 20 and/or the counter/end reflector 15 are coated onto other components such as the gain medium 10 and/or the Q-switch 30. However, it will be appreciated that this need not be the case. For example, the output coupler 20 and/or the counter/end reflector 15 may be provided as separate components and/or by other methods.

In addition, the cavity may be reversed such that the output coupler is formed on the Q-switch and counter reflector on the gain medium 10.

It will be appreciated that a laser resonator 5 as described above may be used in a variety of potential laser based applications and apparatus such as but not limited to a sensor, a laser designator, a rangefinder, a laser illuminated imaging system and/or the like.

Therefore, it will be appreciated that the above specific description is provided by way of example only and that the scope of the invention is defined by the claims.

The invention claimed is:

1. A side pumped laser comprising:
   an elongated gain medium provided between an output coupler and a counter reflector and having a first end, a second end, and sides extending between the first end and the second end; and a pump source configured to provide radiation to the gain medium along at least one of the sides of the gain medium;

wherein the output coupler is configured to receive the radiation from the first end of the gain medium, the second end of the gain medium is configured to receive the radiation from the counter reflector, the laser is configured such that the radiation from the pump source is directly incident on the gain medium without passing through intervening optical components, the pump source is provided proximate, facing, adjacent or in contact with a flat input surface defined by one of the sides of the gain medium, the flat input surface is configured to directly receive the radiation from the pump source, and the gain medium has a cross section that would be a quadrilateral but for the flat input surface of the gain medium that is provided instead of an edge, corner or apex of the gain medium.

2. A side pumped laser according to claim 1, wherein the radiation from the pump source is directly incident on the flat input surface of the gain medium without passing through other optical components.

3. A side pumped laser according to claim 1, wherein the gain medium has the cross section that would be a square or rectangle but for the flat input surface of the gain medium that is provided instead of the edge, corner or apex of the gain medium.

4. A side pumped laser according to claim 1, wherein the laser is configured such that light received from the pump source by the gain medium is diverging and non-focused.

5. A side pumped laser according to claim 1, wherein the gain medium is coated with a reflective and/or thermally conductive coating.

6. A side pumped laser according to claim 1, wherein the pump radiation is matched to a volume of a single TEM00 mode.

7. A side pumped laser according to claim 1, wherein the doping of the gain medium is adapted to tailor a beam spot size to at least one dimension of the gain medium and/or to control the power density of the beam.

8. A side pumped laser according to claim 1, wherein the laser comprises a passive Q-switch.

9. A side pumped laser according to claim 1, wherein the largest dimension of the gain medium and/or the Q-switch and/or the pump source and/or a housing or container in which at least some components of the laser is received is less than 5 cm.

10. An apparatus or system comprising a side pumped laser according to claim 1.

11. The apparatus or system of claim 10, wherein the apparatus or system comprises or is comprised in a sensor, a laser designator or a rangefinder.

12. A method of producing a side pumped laser according to claim 1, the method comprising providing the pump source of the laser in contact with, adjacent or proximate a long side of the gain medium.

13. The apparatus or system according to claim 10, wherein the laser comprises a passive Q-switch.

* * * * *